(12) United States Patent
Jung

(10) Patent No.: US 11,706,548 B2
(45) Date of Patent: Jul. 18, 2023

(54) MEMS MICROPHONE AND METHOD OF MANUFACTURING THE SAME

(71) Applicant: DB HITEK CO., LTD., Seoul (KR)

(72) Inventor: Min Hyun Jung, Chungcheongbuk-do (KR)

(73) Assignee: DB HIKTEK CO., LTD., Seoul (KR)

( * ) Notice: Subject to any disclaimer, the term of this patent is extended or adjusted under 35 U.S.C. 154(b) by 69 days.

(21) Appl. No.: 17/544,633

(22) Filed: Dec. 7, 2021

(65) Prior Publication Data
US 2022/0182745 A1    Jun. 9, 2022

(30) Foreign Application Priority Data

Dec. 7, 2020   (KR) .................. 10-2020-0169487

(51) Int. Cl.
*H04R 1/02* (2006.01)
*B81B 3/00* (2006.01)
*H04R 19/04* (2006.01)
*H04R 31/00* (2006.01)

(52) U.S. Cl.
CPC ........... *H04R 1/026* (2013.01); *B81B 3/0021* (2013.01); *H04R 19/04* (2013.01); *B81B 2201/0257* (2013.01); *B81B 2203/0127* (2013.01); *H04R 31/003* (2013.01); *H04R 2201/003* (2013.01)

(58) Field of Classification Search
CPC .............. H04R 1/026; H04R 2201/003; B81B 3/0021; B81B 2201/0257; B81B 2203/0127
See application file for complete search history.

(56) References Cited

U.S. PATENT DOCUMENTS

| | | | |
|---|---|---|---|
| 2014/0010374 A1* | 1/2014 | Kasai | H04R 3/00 381/26 |
| 2017/0311088 A1* | 10/2017 | Sun | H04R 19/04 |
| 2020/0017357 A1* | 1/2020 | Kim | H04R 7/04 |
| 2020/0021920 A1* | 1/2020 | Sun | B81B 3/001 |
| 2020/0336842 A1* | 10/2020 | Kwon | H04R 19/04 |
| 2022/0182769 A1* | 6/2022 | Park | H04R 31/003 |

* cited by examiner

*Primary Examiner* — Andrew L Sniezek
(74) *Attorney, Agent, or Firm* — Patterson Thuente IP

(57) ABSTRACT

A MEMS microphone includes a substrate, a diaphragm disposed over the substrate to cover the cavity, the diaphragm defining an air gap together with the back plate, and the diaphragm being spaced apart from the substrate, a back plate disposed over the diaphragm and in the vibration area, an upper insulation layer to cover the back plate, a plurality of chamber portions provided in the supporting area, a lower insulation layer provided under the upper insulation layer and on the substrate, and an intermediate insulation layer provided between the lower insulation layer and the upper insulation layer and disposed further from the vibration area than the chamber portions.

16 Claims, 10 Drawing Sheets

MEMS MICROPHONE AND METHOD OF MANUFACTURING THE SAME

CROSS-REFERENCE TO RELATED APPLICATION

This application claims priority to Korean Patent Application No. 10-2020-0169487, filed on Dec. 7, 2020, and all the benefits accruing therefrom under 35 U.S.C. § 119, the contents of which are incorporated by reference in their entirety.

TECHNICAL FIELD

The present disclosure relates to a Micro Electro Mechanical Systems (MEMS) microphone and a method of manufacturing the MEMS microphone. More particularly, the present disclosure relates the MEMS microphone capable of transforming an acoustic wave into an electric signal using a displacement of a diaphragm which occurs due to an acoustic pressure, and the method of manufacturing such a MEMS microphone.

BACKGROUND

Generally, a capacitive microphone utilizes a variable capacitance between a pair of electrodes which are facing each other to transmit an acoustic signal. The capacitive microphone may be manufactured by a semiconductor MEMS process such that the capacitive microphone has a MEMS type having an ultra-small size, which is referred as a MEMS microphone.

It may be required to control an acoustic resistance of the MEMS microphone to adjust a Signal to Noise Ratio (hereinafter referred to as "SNR") value. In order to improve the SNR characteristics, it may be required to reduce a value of a noise generated from the acoustic holes formed in a back plate. Accordingly, in order to reduce the value of the noise while the acoustic wave passes through the acoustic holes, it is necessary to implement a configuration that serves as an acoustic resistance to the acoustic wave.

SUMMARY

The example embodiments of the present invention provide a MEMS microphone capable of reducing a value of a noise which may occur at acoustic holes of a back plate.

The example embodiments of the present invention provide a method of manufacturing a MEMS microphone capable of reducing a value of a noise which may occur at acoustic holes of a back plate.

According to an example embodiment of the present invention, a MEMS microphone includes a substrate having a vibration area defining a cavity, a supporting area surrounding the vibration area, and a peripheral area surrounding the supporting area, a diaphragm disposed over the substrate to cover the cavity, the diaphragm defining an air gap together with the back plate, and the diaphragm being spaced apart from the substrate to be configured to sense an acoustic pressure to generate a corresponding displacement, a back plate disposed over the diaphragm and in the vibration area, and the back plate being spaced apart from the diaphragm to form an air gap, and defining a plurality of first acoustic holes, an upper insulation layer to cover the back plate, the upper insulation layer being configured to hold the back plate to make the back plate being spaced apart from the diaphragm, a plurality of chamber portions provided in the supporting area, spaced apart from each other along a circumference of the vibration area, each of the chamber portions having a lower surface in contact with an upper surface of the substrate, to support the upper insulation layer from the substrate, a lower insulation layer provided under the upper insulation layer and on the substrate and disposed further from the vibration area than the chamber portions, and an intermediate insulation layer provided between the lower insulation layer and the upper insulation layer and disposed outside of the chamber portions, wherein a plurality of slits is provided between the chamber portions with exposing the upper surface of the substrate and communicating with the air gap, and a plurality of spaces is provided outside of the chamber portion, and communicates with the slits, respectively.

In an example embodiment, the MEMS microphone may further include a plurality of second acoustic holes provided to penetrate through the upper insulation layer over the slits to serve as a fluid path of etchant for forming the spaces by removing the lower insulation layer and the intermediate insulation layer.

In an example embodiment, the MEMS microphone may further include a diaphragm pad positioned on the lower insulation layer and electrically connected to the diaphragm, and a back plate pad positioned on the intermediate insulation layer and electrically connected to the back plate, wherein the diaphragm pad and the back plate pad are respectively connected to the diaphragm and the back plate through the slits.

In an example embodiment, the diaphragm may include a plurality of vent holes penetrating through the diaphragm, and spaced apart from each other along one circumference of the diaphragm.

Here, the vent holes may be alternatively arranged with the first acoustic holes, respectively, to prevent an acoustic wave to be directly transmitted between the vent holes and the first acoustic holes.

In an example embodiment, the MEMS microphone may further include an anchor connected to an end portion of the diaphragm along a circumference of the diaphragm to be anchored to a lower surface of the substrate to support the diaphragm from the substrate.

According to an example embodiment of the present invention, a method of manufacturing a MEMS microphone by forming an insulation layer on a substrate being divided into a vibration area, a supporting area surrounding the vibration area and a peripheral area surrounding the supporting area, forming a diaphragm in the vibration area and an anchor supporting the diaphragm in the supporting area, respectively, on the lower insulation layer, forming an intermediate insulation layer on the lower insulation layer on which the diaphragm is formed, forming a back plate on the intermediate insulation layer in the vibration area, the back plate facing the diaphragm, patterning the intermediate insulation layer and the lower insulation layer in the supporting area to form a plurality of chamber channels for forming chambers, being spaced apart from each other along a periphery of the vibration area, depositing an insulating layer on the intermediate insulation layer in which the back plate and the chamber channels, patterning the insulating layer to form the upper insulation layer for holding the back plate to make the back plate spaced apart from the diaphragm, and chambers portions spaced apart from each other for supporting the back plate, patterning the back plate and the upper insulation layer to form first acoustic holes of penetrating the back plate and the upper insulation layer, patterning the substrate to form a cavity to partially expose the lower insulation layer in the vibration area, and performing an etch process using the cavity and the first acoustic holes with completely removing portions of the lower insulation layer and the intermediate insulation layer in both the vibration area and the supporting area, and partially removing the portions in the peripheral area to form an air gap between the diaphragm and the back plate, a plurality of slits communicating with the air gap, disposed between the chamber portions, and spaces outside of the chamber portions, communicating with the slits, respectively.

In an example embodiment, forming the first acoustic holes may include forming second acoustic holes disposed between the chamber portions, respectively, and penetrating through the upper insulation layer, wherein the second acoustic holes serve as fluid paths for an etchant for forming the spaces by removing the lower insulation layer and the intermediate insulation layer.

In an example embodiment, forming of the diaphragm and the anchor may include patterning the lower insulation layer to form an anchor channel for forming the anchor in the supporting area, forming a first silicon layer on the lower insulation layer on which the anchor channel is formed, and patterning the first silicon layer to form the diaphragm in the vibration area and the anchor in the supporting area.

Here, forming the diaphragm and the anchor may include patterning the first silicon layer to form a plurality of vent holes of penetrating the diaphragm, and the vent holes are located in the vibration area.

Further, the vent holes may be alternatively arranged with the first acoustic holes, respectively, to prevent an acoustic wave to be directly transmitted between the vent holes and the first acoustic holes.

Here, the vent holes may serve as fluid paths for an etchant for removing the lower insulation layer and the intermediate insulation layer.

Furthermore, forming the diaphragm and the anchor may include patterning the first silicon layer to form a diaphragm pad in the peripheral area, being electrically connected to the diaphragm.

Here, the diaphragm pad may be connected to the diaphragm through a space between the chamber portions adjacent to each other.

In an example embodiment, forming the back plate may include forming a second silicon layer on the intermediate insulation layer, and patterning the second silicon layer to forming the back plate in the vibration area and a back plate pad connected to the back plate in the peripheral area simultaneously.

Here, the back plate pad may be connected to the back plate through a space between the chamber portions adjacent to each other.

According to some example embodiments of the present invention, the spaces are formed between the chamber portions, the lower insulation layer and the intermediate insulation layer. Since the spaces communicate with the air gap through the slits, an acoustic wave may pass between the air gap and the spaces. The spaces may serve as band stop filters that may suppresses or attenuates an integrity of a signal having a specific frequency in the acoustic wave. Since the spaces may attenuate the noise component of the signal having the specific frequency in the acoustic wave, the MEMS microphone may have improved signal-to-noise ratio (SNR) characteristics.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Exemplary embodiments can be understood in more detail from the following description taken in conjunction with the accompanying drawings, in which.

Figure 1:
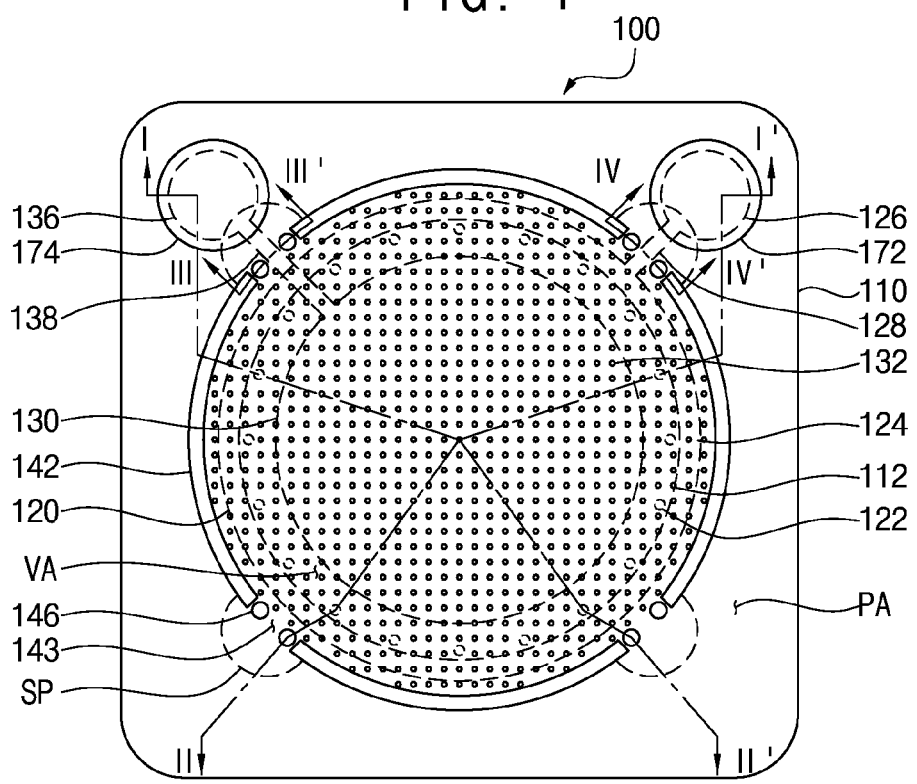
FIG. 1 is a plan view illustrating a MEMS microphone in accordance with an embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 2:
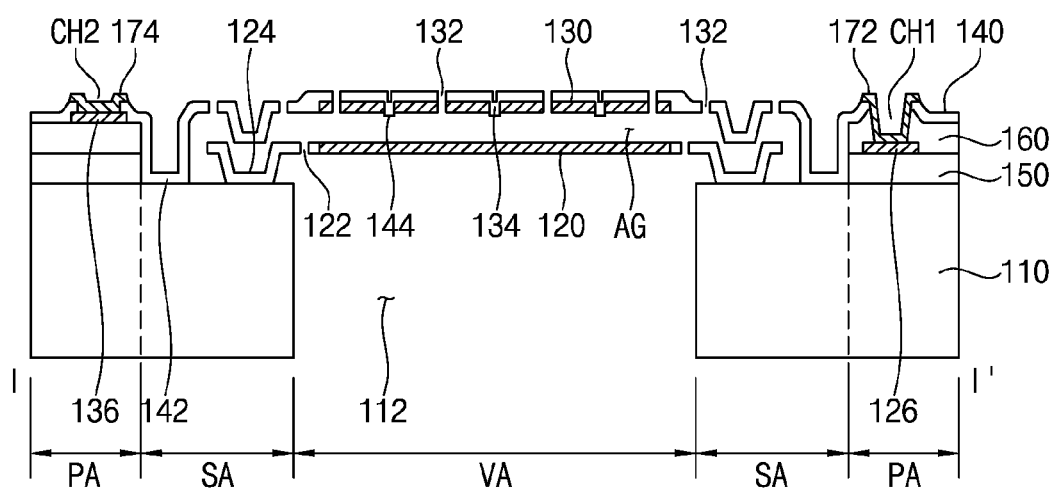
FIG. 2 is a cross sectional view taken along a line I-I' in FIG. 1.
Figure 3:
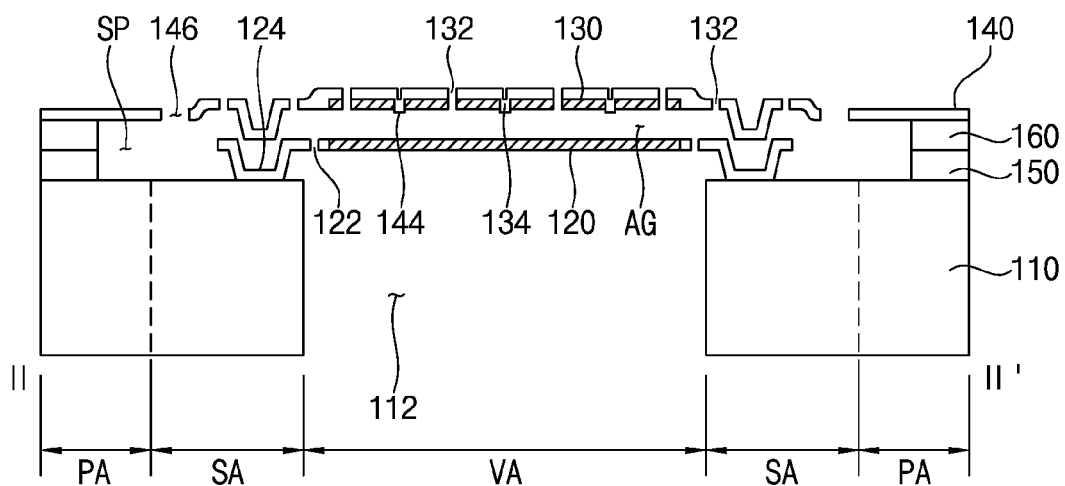
FIG. 3 is a cross sectional view taken along a line II-II' in FIG. 1.
Figure 4:
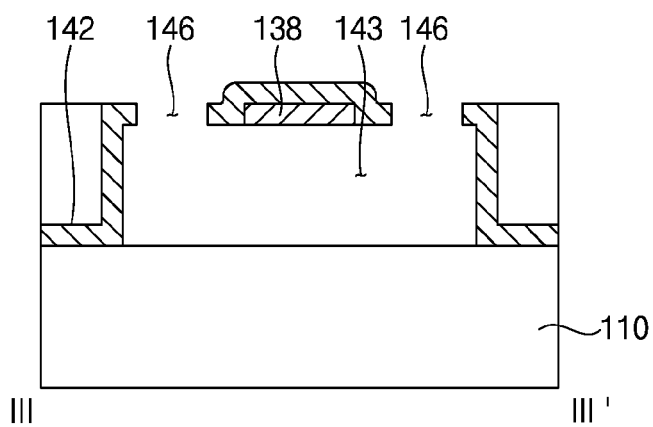
FIG. 4 is a cross sectional view taken along a line III-III' in FIG. 1.
Figure 5:
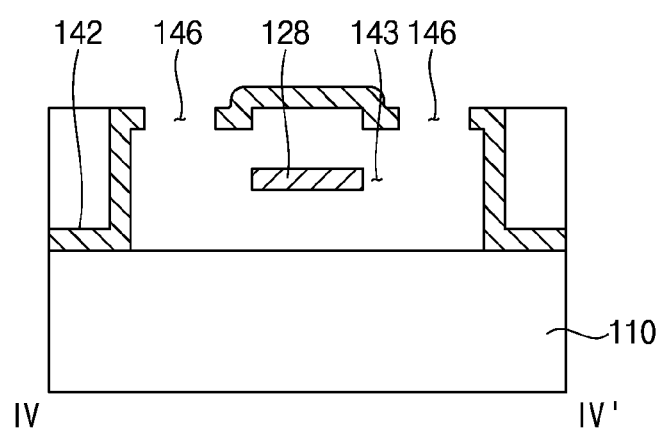
FIG. 5 is a cross sectional view taken along a line IV-IV' in FIG. 1.

FIG. 1 is a plan view illustrating a MEMS microphone in accordance with an embodiment of the present invention. FIG. 2 is a cross sectional view taken along a line I-I' in FIG. 1. FIG. 3 is a cross sectional view taken along a line II-II' in FIG. 1. FIG. 4 is a cross sectional view taken along a line III-III' in FIG. 1. FIG. 5 is a cross sectional view taken along a line IV-IV' in FIG. 1.

Referring to FIGS. 1 to 5, a MEMS microphone 100 is shown that is capable of generating a displacement in response to an acoustic pressure to convert an acoustic signal into an electrical signal and output the electrical signal. The MEMS microphone 100 in accordance with an example embodiment of the present invention includes a substrate 110, a diaphragm 120 and a back plate 130.

The substrate 110 is divided into a vibration area VA, a supporting area SA surrounding the vibration area VA and a peripheral area PA surrounding the supporting area SA. In the vibration area VA, a cavity 112 penetrating through the substrate in a vertical direction is formed. Thus, the cavity 112 may define the vibration area VA.

For example, the cavity 112 may have a substantially circular or ring shape, and may have a size corresponding to the vibration area VA.

The diaphragm 120 may be positioned over the substrate 110. The diaphragm 120 may have a membrane structure to cover the cavity 112. The diaphragm 120 is exposed through the cavity 112. The diaphragm 120 is spaced apart from the substrate 110 in a vertical direction and is configured to be bendable in response to an acoustic pressure.

The diaphragm 120 may have an ion implantation region into which impurities such as type III elements or type V elements are doped. The ion implantation region may correspond to the vibration area VA. The diaphragm 120 may have a substantially circular shape.

In particular, the diaphragm 120 may have an end portion being connected to an anchor 124. The anchor 124 is positioned in the supporting area SA of the substrate 110. The anchor 124 may extend along a circumference of the diaphragm 120. The anchor 124 may have a ring shape and may surround the cavity 112.

The anchor 124 may be disposed in the supporting area SA, and supports the diaphragm 120. The anchor 124 extends from the end portion of the diaphragm 120 toward the substrate 110 to separate the diaphragm 120 from the substrate 110.

For example, the anchors 124 may be integrally formed with the diaphragm 120. The anchor 124 has a lower surface in contact with an upper surface of the substrate 110 and fixed to the substrate 110.

As another example, although not shown, a plurality of anchors 124 may be provided along a circumference of the diaphragm 120 and spaced apart from each another. Specifically, each of the anchors 124 may have a columnar shape. Each of the anchors 124 may have a vertical section of a "U" shape. An empty space formed between the anchors 124 adjacent to each other may serve as a path through which the acoustic wave flows.

In an example embodiment, the diaphragm 120 may have a plurality of vent holes 122. The vent holes 122 may be arranged along the anchor 124 and may be spaced apart from one another to be arranged in a ring shape. The vent holes 122 may penetrate through the diaphragm 120 to communicate with the cavity 112. The vent holes 122 may serve as vent channels for the acoustic wave to flow. Further, the vent holes 122 may serve as fluid paths for an etchant to flow while manufacturing the MEMS microphone 110.

The vent holes 122 are positioned in the vibration area VA. Alternatively, the vent holes 122 may be arranged along a boundary between the vibration area VA and the supporting area SA or in the supporting area SA adjacent to the vibration area VA.

The back plate 130 may be positioned over the diaphragm 120. The back plate 130 may be disposed in the vibration area VA. The back plate 130 is spaced apart from the diaphragm 120 and faces the diaphragm 120. Like the diaphragm 120, the back plate 130 may have a circular shape.

In an example embodiment, the MEMS microphone 110 may further include an upper insulation layer 140 and a plurality of chamber portions 142 for supporting the back plate 140 from the substrate 110.

In particular, the upper insulation layer 140 may be disposed over the substrate 110. The upper insulation layer 140 may also cover an upper surface of the back plate 130. The upper insulation layer 140 may hold the back plate 130 to make the back plate 130 spaced apart from the diaphragm 120. Thus, since the back plate 130 is spaced apart from the diaphragm 120, the diaphragm 120 may freely vibrate in response to any incident acoustic pressure. Further, an air gap AG may be formed between the diaphragm 120 and the back plate 130.

The back plate 130 may include a plurality of first acoustic holes 132 through which the acoustic pressure passes. The first acoustic holes 132 may penetrate through the back plate 130 and the upper insulation layer 140 to communicate with the air gap AG. Further, the first acoustic holes 132 may be arranged in the supporting area SA by penetrating through the upper insulation layer 140.

The first acoustic holes 132 may be disposed to be alternatively arranged with the vent holes 122 in a vertical direction. That is, the first acoustic holes 132 and the vent holes 122 may not be overlapped with each other in the vertical direction. Accordingly, the acoustic wave may be prevented from being directly transmitted between the vent holes 122 and the first acoustic holes 132. That is, after the acoustic wave passes through the vent holes 122, the acoustic wave may be prevented from being directly transmitted to the first acoustic holes 132. Further, after the acoustic wave passes through the first acoustic holes 132, the acoustic wave may be prevented from being directly transmitted to the vent holes 122.

In an example embodiment, the back plate 130 may have a plurality of dimple holes 134, and the upper insulation layer 140 may have a plurality of dimples 144 positioned to correspond to those of the dimple holes 134. The dimple holes 134 penetrate through the back plate 130, and the dimples 144 are provided at positions where the dimple holes 134 are formed.

The dimples 144 may protrude from a lower surface of the back plate 130 toward the diaphragm 120. Thus, the dimples 144 may prevent the diaphragm 120 from being coupled to the lower surface of the back plate 130.

In particular, the diaphragm 120 may be bent up and down in accordance with the acoustic pressure. A degree of bending of the diaphragm 120 varies according to a magnitude of the acoustic pressure. Even when the diaphragm 120 is severely bent (e.g., so much that the diaphragm 120 contacts the back plate 130), the dimples 144 may separate the diaphragm 120 and the back plate 130 from one another so that the diaphragm 120 may return to an initial position rather than becoming stuck in contact with one another more permanently.

The chamber portions 142 may be positioned in the supporting area SA and adjacent to the boundary between the supporting area SA and the peripheral area PA, and support the upper insulation layer 140 such that the upper insulation layer 140 and the back plate 130 are spaced apart from the diaphragm 120. The chamber portions 142 are formed by bending the upper insulation layer 140 toward the substrate 110. As shown in FIG. 2, lower surfaces of the chamber portions 142 may be disposed in contact with the upper surfaces of the substrate 110.

The chamber portions 142 are spaced outwardly apart from the diaphragm 120 and may be located outside of the anchor 124. The chamber portions 142 may be arranged to have a substantially ring shape, and may be disposed to surround the diaphragm 120.

For example, each of the chamber portions 142 may be provided integrally with the upper insulation layer 140, and may have a 'U'-shaped longitudinal cross-section.

The chamber portions 142 may be spaced apart from each other. Slits 143 may be provided between the chamber portions 142 adjacent to each other. The slits 143 may expose the upper surface of the substrate 110 and communicate with the air gap AG.

In some embodiments, the MEMS microphone 100 may further include a lower insulation layer 150, a diaphragm pad 126, an intermediate insulation layer 160, a back plate pad 136, a first pad electrode 172 and a second pad electrode 174.

In particular, the lower insulation layer 150 may be formed on the upper surface of the substrate 110 and beneath the upper insulation layer 140. The lower insulation layer 150 may be located in the peripheral area PA and outside of the chamber portions 142.

The diaphragm pad 126 may be formed on the upper face of the lower insulation layer 150. The diaphragm pad 126 may be positioned in the peripheral area PA. The diaphragm pad 126 may be electrically connected to the diaphragm 120. The diaphragm pad 126 may be doped with impurities through an ion implantation process. Although not specifically illustrated in the drawings, while the impurities may be doped into the diaphragm pad 126, the impurities may be also doped with a first connection portion 128 which connects the diaphragm 120 to the diaphragm pad 126. In this case, the first connection portion 128 may connect the diaphragm 120 and the diaphragm pad 126 through one of the slits 143. Accordingly, the first connection portion 128 may not interfere with the chamber portions 142.

The intermediate insulation layer 160 may be formed on the lower insulation layer 150 having the diaphragm pad 126. The intermediate insulation layer 160 is interposed between the lower insulation layer 150 and the upper insulation layer 140, and is located in the peripheral area PA. The intermediate insulation layer 160 may be positioned outside of the chamber portions 142.

In addition, the lower insulation layer 150 and the intermediate insulation layer 160 may be formed using a material different from that of the upper insulation layer 140. For example, the upper insulation layer 140 may include a nitride such as silicon nitride, and the lower insulation layer 150 and the intermediate insulation layer 160 may include an oxide such as silicon oxide.

The back plate pad 136 is positioned in the peripheral area PA and may be provided on the upper surface of the intermediate insulation layer 160. The back plate pad 136 is electrically connected to the back plate 130 and may be doped with impurities through an ion implantation process. Although not specifically illustrated in the drawings, impurities may be doped into both the back plate pad 136 and a second connection portion 138 which connects the back plate pad 136 to the back plate 130. In this case, the second connection portion 138 may connect the back plate 130 to the back plate pad 136 through one of the slits 143. Accordingly, the second connection portion 138 may not interfere with the chamber portions 142.

Spaces SP may be provided outside of the chamber portions 142 in the horizontal direction. The spaces SP may communicate with the slits 143, respectively. For example, the spaces SP may be defined by the chamber portions 142, the lower insulation layer 150 and the intermediate insulation layer 160.

Since the spaces SP communicate with the air gap AG through the slits 143, the acoustic wave may pass through the air gap AG to reach to the spaces SP. Since the spaces SP are located on a path through which the acoustic wave passes, each of the spaces SP may serve as a band stop filter that suppresses or attenuates a signal having a specific frequency in the acoustic wave. Since the spaces SP can attenuate the noise component of the signal having the specific frequency in the acoustic wave, the MEMS microphone 100 may have improved signal-to-noise ratio (SNR) characteristics.

The upper insulation layer 140 may further include second acoustic holes 146. The second acoustic holes 146 may be provided above each of the slits 143 and may penetrate through the upper insulation layer 140. That is, the second acoustic holes 146 may be disposed between the chamber portions 142 adjacent to each other. The second acoustic holes 146 may serve as fluid paths for an etchant for forming the spaces SP by removing the lower insulation layer 150 and the intermediate insulation layer 160 partially. By providing the second acoustic holes 146, the spaces SP can be accurately formed to have a uniform size.

Also, the second acoustic holes 146 may serve as passages for the acoustic waves to pass through.

A first contact hole CH1 is located in the peripheral area PA. The first contact hole CH1 penetrates through the upper insulation layer 140 and the intermediate insulation layer 160 to exposes the diaphragm pad 126.

In addition, a second contact hole CH2 is located in the peripheral area PA. The second contact hole CH2 penetrates through the upper insulation layer 140 to exposes the back plate pad 136.

The first pad electrode 172 may be provided on the diaphragm pad 138 in the peripheral area PA. Accordingly, the first pad electrode 172 may be electrically connected to the diaphragm pad 126.

The second pad electrode 174 may be positioned above the back plate pad 136 in the peripheral area PA and may be electrically connected to the back plate pad 136.

As described above, the MEMS microphone 100 is provided with the spaces SP communicating with the air gap AG, and the spaces SP can function as the band stop filter. Thus, the spaces SP may attenuate the noise component of the specific frequency in the acoustic wave. Accordingly, the MEMS microphone 100 may have improved signal-to-noise ratio (SNR) characteristics.

Hereinafter, a method of manufacturing a MEMS microphone will be described in detail with reference to the drawings.

Figure 6:
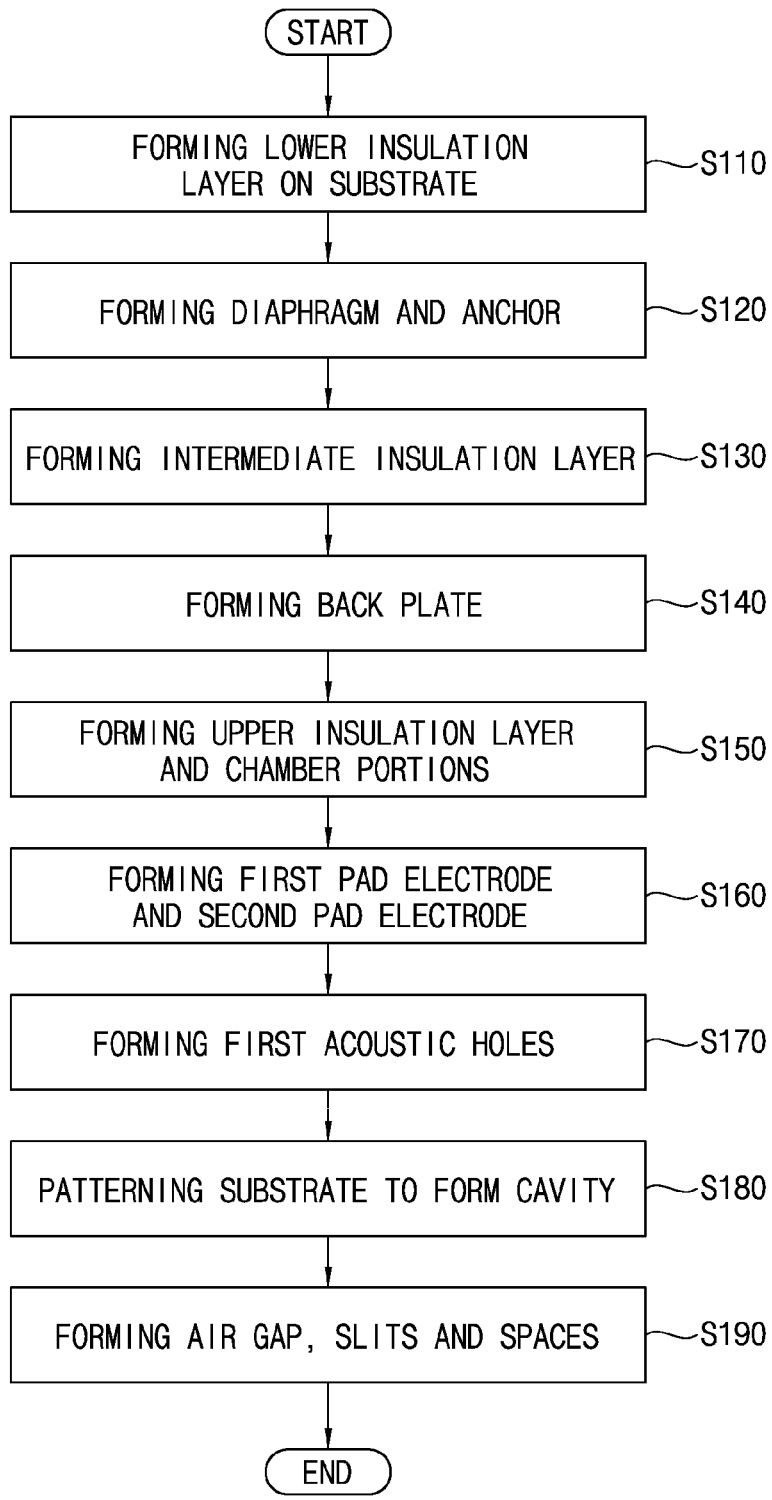
FIG. 6 is a flow chart illustrating a method of manufacturing a MEMS microphone in accordance with an embodiment of the present invention.

FIG. 6 is a flow chart illustrating a method of manufacturing a MEMS microphone in accordance with an embodiment of the present invention. FIGS. 7 to 19 are cross sectional views illustrating a method of manufacturing a MEMS microphone in accordance with an embodiment of the present invention.

Figure 7:
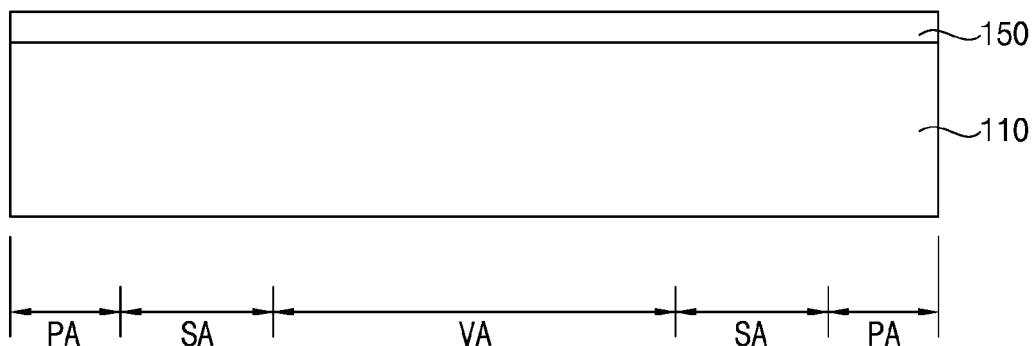
FIGS. 7 to 19 are cross sectional views illustrating a method of manufacturing a MEMS microphone in accordance with an embodiment of the present invention.

Referring to FIGS. 6 and 7, according to an example embodiment of a method for manufacturing a MEMS microphone, a lower insulation layer 150 is formed on a substrate 110 (at S110).

The lower insulation layer 150 may be formed through a deposition process. The lower insulation layer 150 may be formed using an oxide such as a silicon oxide.

Figure 8:
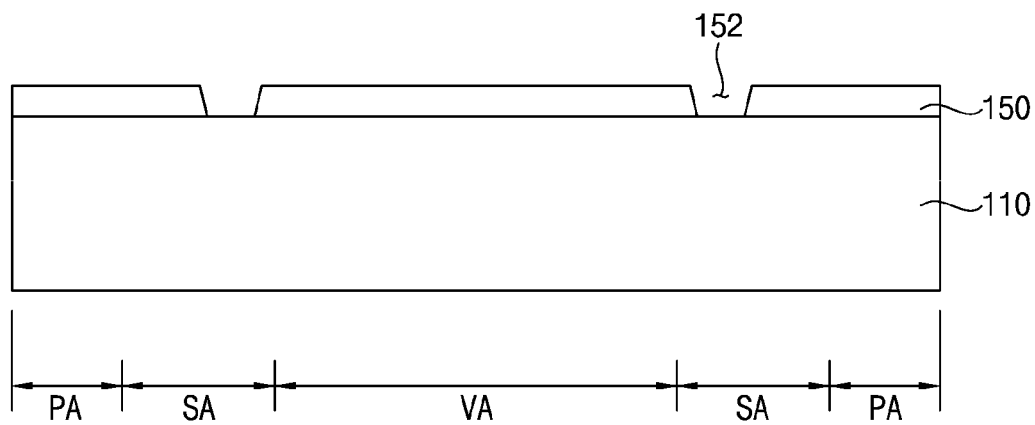
Figure 9:
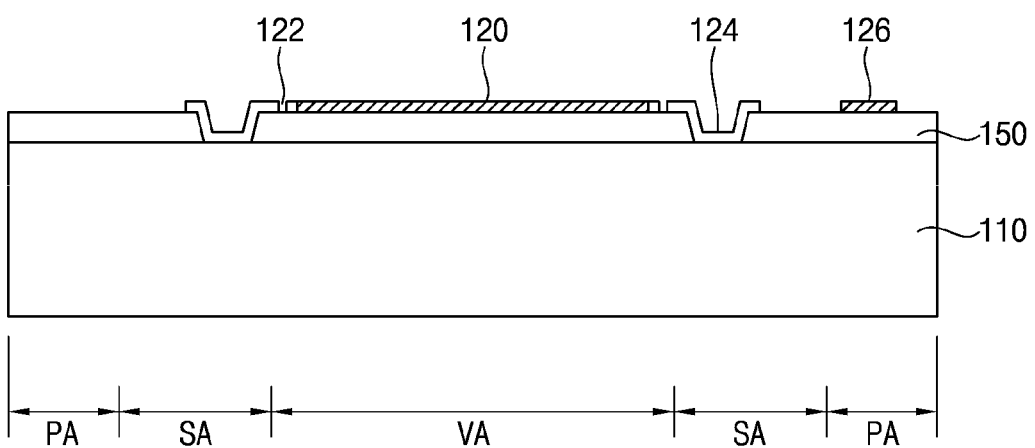

Referring to FIGS. 6, 8 and 9, a diaphragm 120, vent holes 122, an anchor 124 and a diaphragm pad 126 are formed on the lower insulation layer 150 (at S120).

The diaphragm 120, the vent holes 122, the anchor 124 and the diaphragm pad 126 are formed by the subsidiary steps as illustrated in detail as below.

Firstly, the lower insulation layer 150 is patterned by an etching process to form an anchor channel 152 for forming the anchor 124 to partially expose a lower surface of the substrate 110. The anchor channel 152 is formed at a supporting area SA of the substrate 110. For example, the anchor channel 152 has a ring shape of surrounding a vibration area VA.

Then, a first silicon layer 10 is formed on the lower insulation layer 150 having the anchor channel 152. For example, the first silicon layer 10 may be formed using polysilicon.

An ion implanting process is then performed to dope both the vibration area VA of the first silicon layer 10 and a portion of the first silicon layer 10, corresponding to a position of a diaphragm pad 126, with impurities.

The first silicon layer 10 is patterned to form a diaphragm 120 and the anchor 124, Further, a diaphragm pad 126 may be formed on the first insulation layer 150 and in a peripheral area PA.

In an example embodiment, the anchor 124 may be formed to have a ring shape along a circumference of the diaphragm 120.

Alternatively, a plurality of anchors 124 is arranged to be spaced apart from each other along the circumference of the diaphragm 120. Further slits may be formed between the anchors adjacent to each other. The slit may serve as a fluid pathway for etchant for removing a portion of an intermediate insulation layer 160, disposed between the diaphragm 120 and the back plate 130.

When the diaphragm 120, the anchor 124 and the diaphragm pad 126 are formed, a plurality of vent holes 122 may also be formed by penetrating through the diaphragm 120. The vent holes 122 are located in the vibration area VA. The vent holes 122 are spaced apart from each other along the anchor 124 and may be formed in a pattern of a ring shape.

Figure 10:
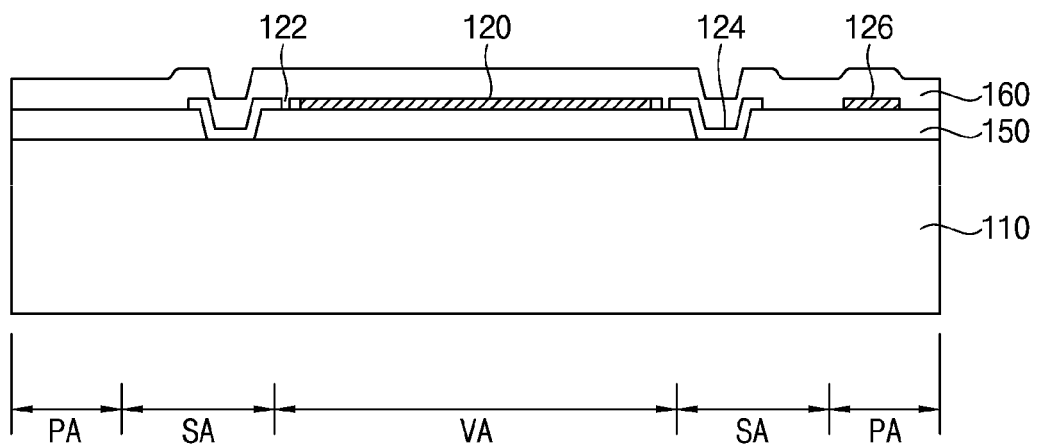

Referring to FIGS. 6 and 10, the intermediate insulation layer 160 is formed on the lower insulation layer 150 on which the diaphragm 120, the vent holes 122, the anchor 124 and the diaphragm pad 126 are formed (at S130).

The intermediate insulation layer 160 may be formed by a deposition process. The intermediate insulation layer 160 may be formed using a material identical to that of the lower insulation layer 150. For example, the intermediate insulation layer 160 is formed using an oxide such as silicon oxide or TEOS.

The intermediate insulation layer 160 may fill the vent holes 122. Accordingly, the vent holes 122 may be filled with the oxide.

Figure 11:
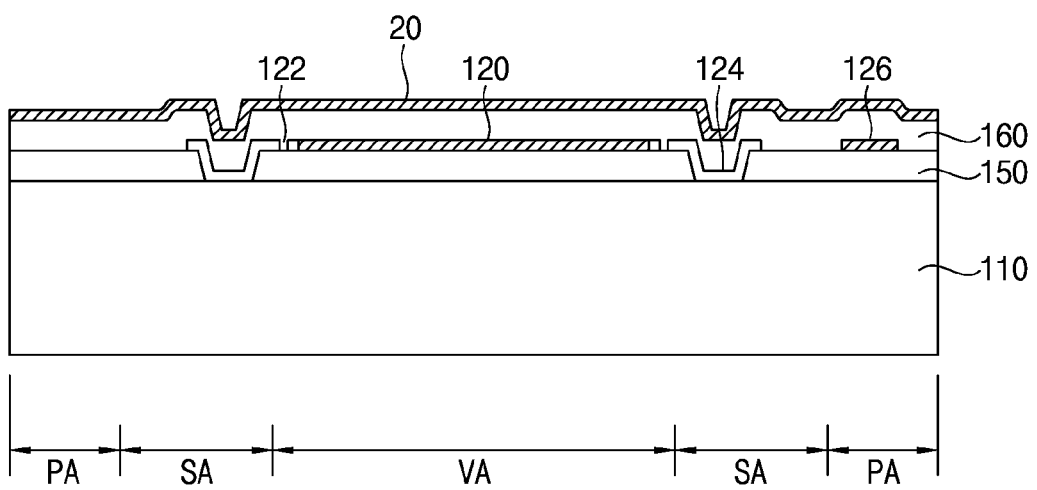
Figure 12:
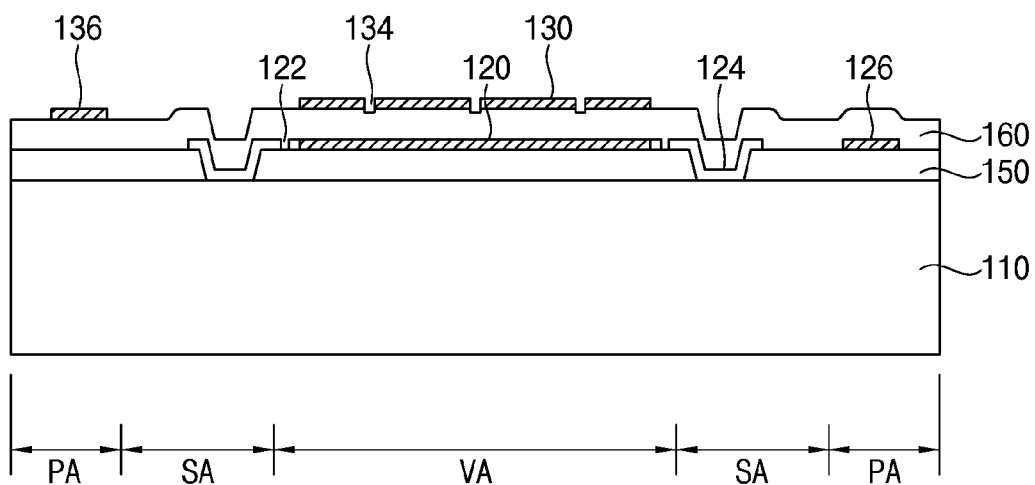

FIGS. 6, 11 and 12, a back plate 130 and a back plate pad 136 are formed on the intermediate insulation layer 160 (at S140).

First, a second silicon layer 20 is deposited on an upper surface of the intermediate insulation layer 160 and then impurities are doped into the second silicon layer 20 through an ion implantation process. For example, the second silicon layer 20 may be made of polysilicon.

The second silicon layer 20 is patterned to form dimple holes 134 for forming dimples 144 (refer to FIG. 2). The dimple holes 134 may be formed in the vibration area VA. Specifically, the dimple holes 114 may be provided in a region where the back plate 130 is to be formed. A portion of the intermediate insulation layer 160 corresponding to the dimple hole 134 may be partially etched so that the dimples 144 protrude from a lower surface of the back plate 130 downwardly.

Next, the second silicon layer 20 is patterned to form the back plate 130 and the back plate pad 136. The back plate 130 may be formed in the vibration area VA, and the back plate pad 136 may be formed in the peripheral area PA. In this case, a second connection portion 138 may connect the back plate 130 and the back plate pad 136 to each other (see FIG. 1).

Figure 13:
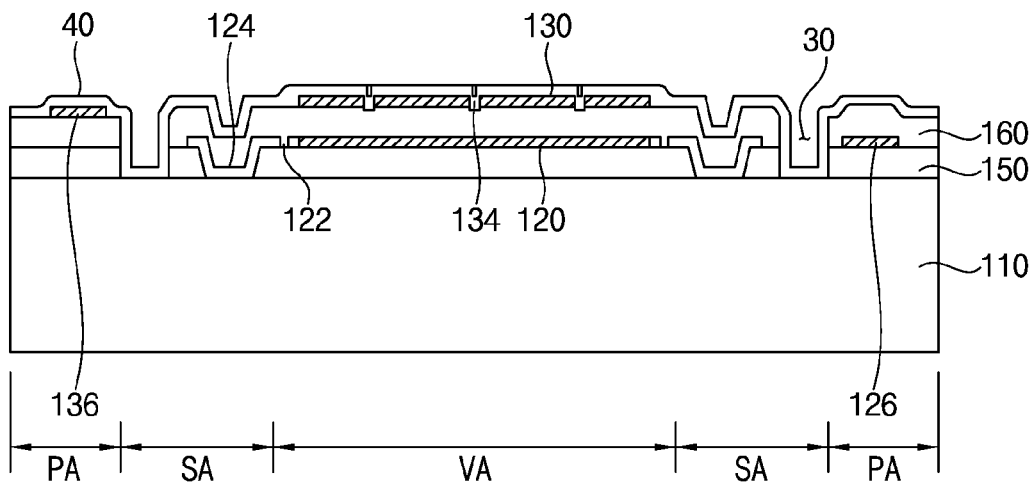
Figure 14:
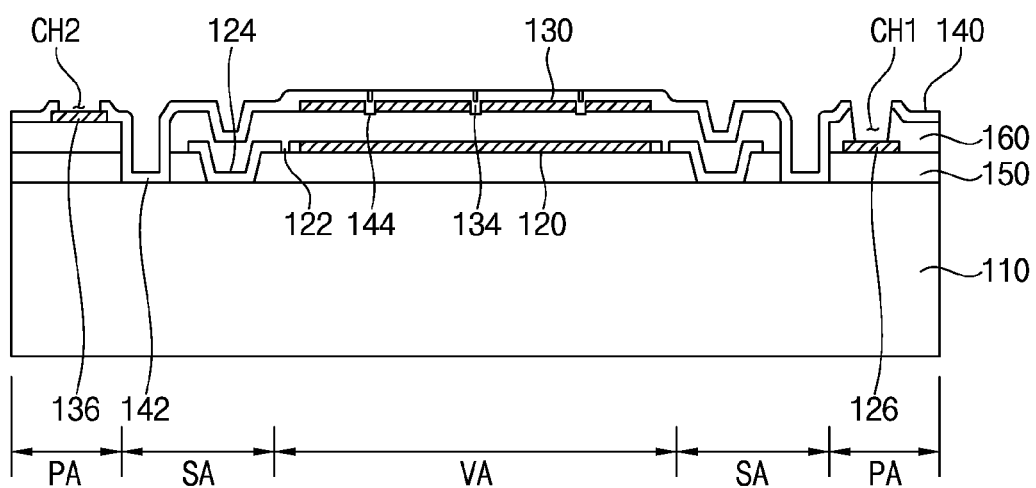

Referring to FIGS. 6, 13 and 14, an upper insulation layer 140 and chamber portions 142 are formed on the intermediate insulation layer 160 on which the back plate 130 and the back plate pad 136 are formed (at S150).

Specifically, the intermediate insulation layer 160 and the lower insulation layer 150 are patterned through an etching process to form chamber channels 30 for forming chamber portions 142 (see FIG. 2) in the supporting area SA. The substrate 110 may be partially exposed through the chamber channels 30. Although not specifically illustrated in the drawings, the chamber channels 30 may be spaced apart from each other, and the chamber channels 30 are arranged to have a substantially ring shape to surround the diaphragm 120. Also, the first connection porting 128 and the second connection portion 138 may be positioned between the chamber channels 30.

After depositing an insulation layer 40 on the intermediate insulation layer 160 on which the chamber channels 30 are formed, the insulation layer 40 is patterned to form the upper insulation layer 140 and the chamber portions 142. The chamber portions 142 may be spaced apart from each other and may be arranged to have a substantially ring shape.

Further, the dimples 144 are formed in the dimple holes 134 while depositing the insulation layer 40 on the intermediate insulation layer 160.

By patterning the insulation layer 40, a second contact hole CH2 is formed in the peripheral area PA to expose the back plate pad 136. Then, portions of the insulation layer 40 and the intermediate insulation layer 160, which face the upper surface of the diaphragm pad 126, are removed to form the first contact hole CH1. The diaphragm pad 126 is exposed through the first contact hole CH1.

The upper insulation layer 140 may be made of a material different from those of the lower insulation layer 150 and the intermediate insulation layer 160. For example, the upper insulation layer 140 may be made of a nitride such as silicon nitride, and the lower insulation layer 150 and the intermediate insulation layer 160 may be made of the oxide.

Figure 15:
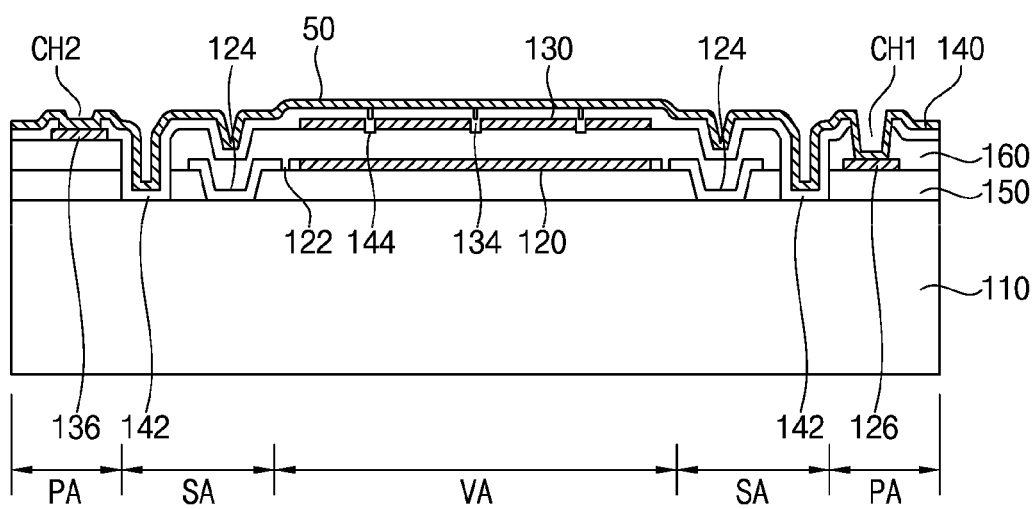
Figure 16:
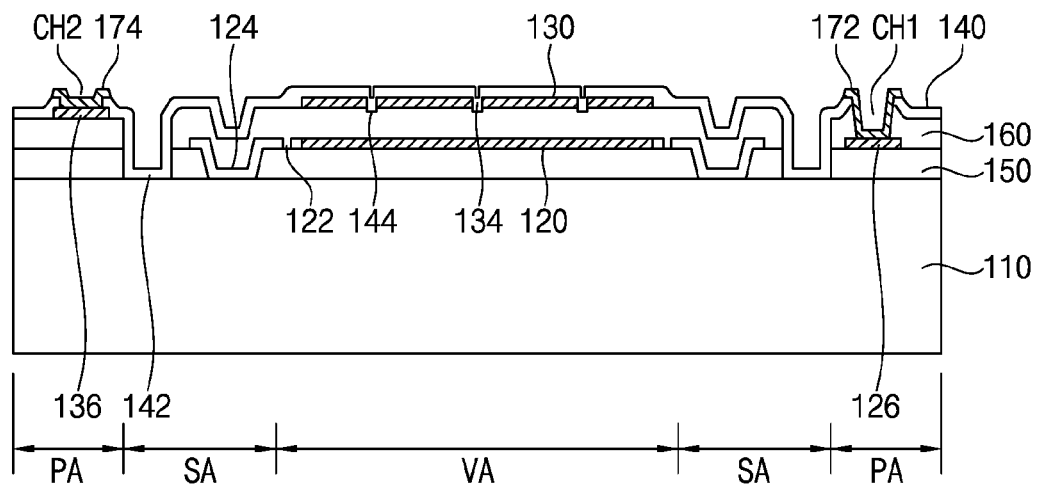

FIGS. 6, 15 and 16, a first pad electrode 172 and a second pad electrode 174 are formed in the first contact hole CH1 and the second contact holes CH2 in the peripheral area PA (at S160).

Specifically, a thin layer 50 is deposited on the upper insulation layer 140 in which the first contact hole CH1 and the second contact holes CH2 are formed. Here, the thin layer 50 may be made of a conductive metal material.

The thin layer 50 is patterned to form the first pad electrode 172 and the second pad electrode 174. In this case, the first pad electrode 172 may be formed on the diaphragm pad 126, and the second pad electrode 174 may be formed on the back plate pad 136.

Figure 17:
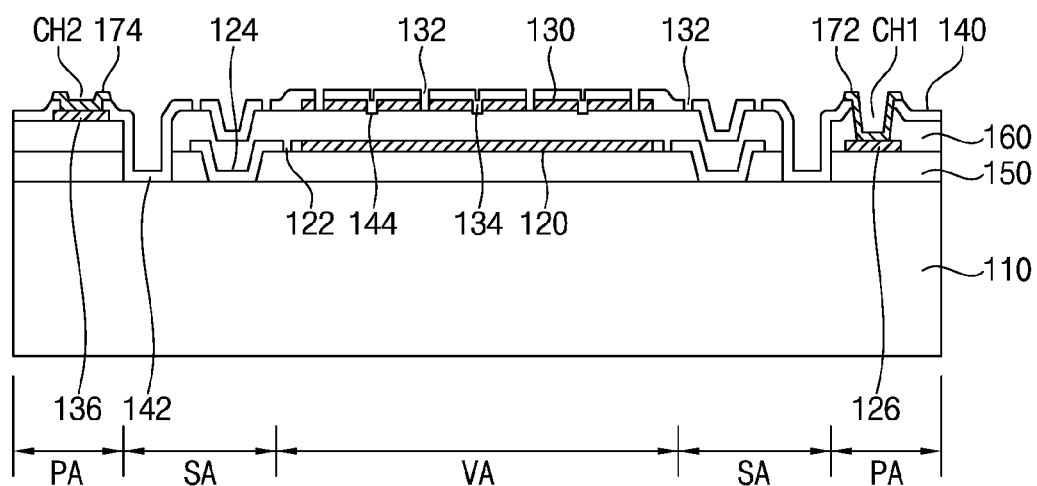

Referring to FIGS. 6 and 17, the upper insulation layer 140 and the back plate 130 are patterned to form first acoustic holes 132 in the vibration area VA (at S170).

Further, in the support area SA, the first acoustic holes 132 may be formed to penetrate through only the upper insulation layer 140.

In this case, the first acoustic holes 132 may be disposed to be alternatively arranged with the vent holes 122. That is, the first acoustic holes 132 and the vent holes 122 may not be vertically overlapped with one another in a vertical direction. Accordingly, the acoustic wave may be prevented from being directly transmitted between the vent holes 122 and the first acoustic holes 132. That is, after the acoustic wave passes through the vent holes 122, the acoustic wave may be prevented from being directly transmitted to the first acoustic holes 132. Further, after the acoustic wave passes through the first acoustic holes 132, the acoustic wave may be prevented from being directly transmitted to the vent holes 122.

Figure 18:
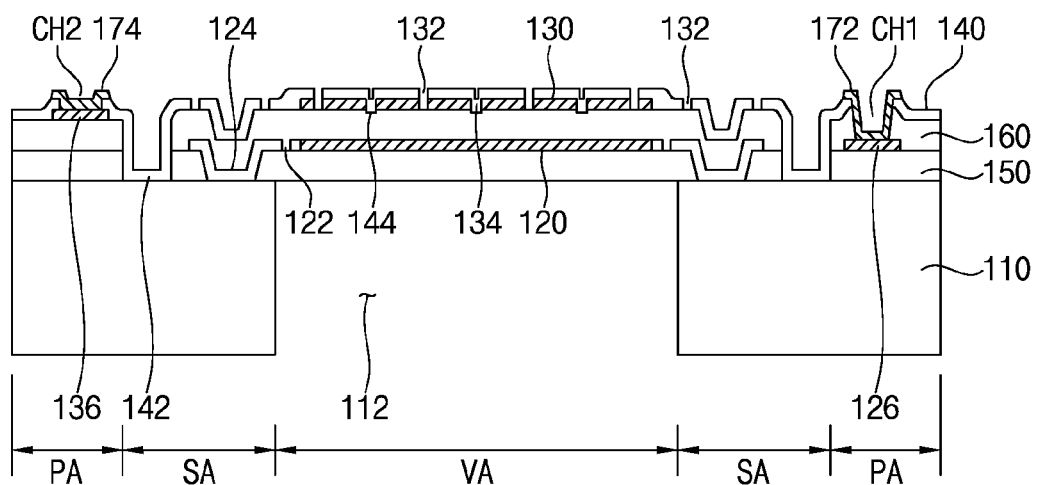

FIGS. 6 and 18, after the first acoustic holes 132 and second acoustic holes 146 are formed, the substrate 110 is patterned to form a cavity 112 in the vibration area VA. (at S180).

The lower insulation layer 150 is partially exposed through the cavity 112.

Figure 19:
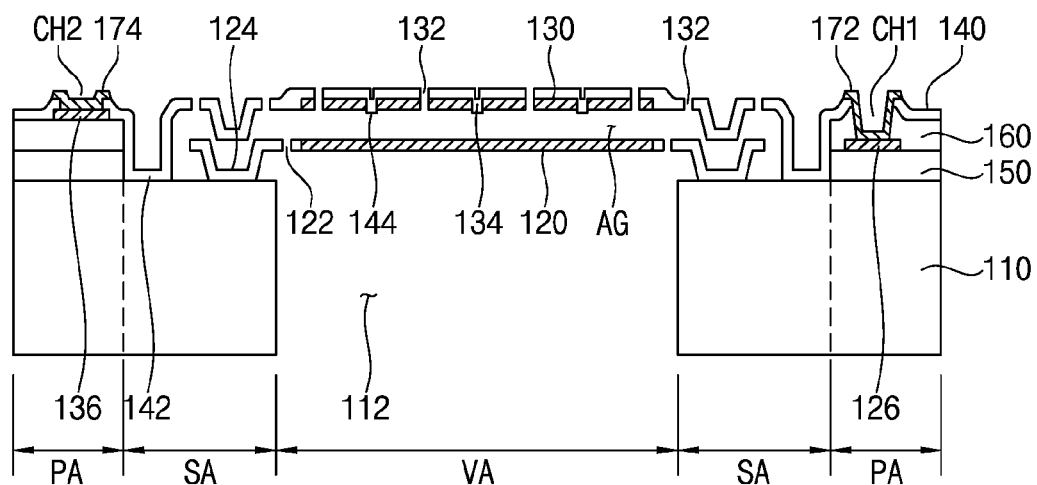

FIGS. 6 and 19, through an etching process using the cavity 112, the first acoustic holes 132, the second acoustic holes 146 and the vent holes 122, the lower insulation layer 150 and the intermediate insulation layer 160 are removed completely from both the vibration area VA and the supporting area SA, and partially from the peripheral area PA to form an air gap AG between the diaphragm 120 and the back plate 130, a plurality of slits 143 between the chamber portions 142 adjacent to each other, communicating with the air gap AG, and spaces SP outside of the chamber portions 142, communicating with the slits 142, respectively (at S190).

Specifically, the cavity 112, the first acoustic holes 132, the second acoustic holes 146 and the vent holes 122 may be provided as fluid paths of the etchant for removing the lower insulation layer 150 and the intermediate insulation layer 160.

In particular, the second acoustic holes 146 may serve as a fluid path of etchant for forming the spaces SP. Owing to the second acoustic holes 146, the spaces SP may be accurately formed to have a uniform size. Etching amounts of the intermediate insulation layer 160 and the lower insulation layer 150 may be adjusted by changing sizes or numbers of the first acoustic holes 146. Accordingly, the spaces SP may have adjustable sizes.

Meanwhile, the anchor 124 and the chamber portions 142 serve to limit the flow area of the etchant.

For example, hydrogen fluoride vapor (HF vapor) may be used as the etchant for removing the intermediate insulation layer 160 and the lower insulation layer 150.

The lower insulation layer 150 and the intermediate insulation layer 160 from the vibration area VA and the support area SA are entirely removed to expose the diaphragm 120 through the cavity 112, and the air gap AG between the diaphragm 120 and the back plate 130, and the slits 143 between the chamber portions 142 adjacent to each other.

Since the first connection portion 128 and the second connection portion 138 communicate with the slits 143, the first connection portion 128 and the second connection portion 138 may not interfere with the chamber portions 142 (see FIGS. 4 and 5).

By partially removing the lower insulation layer 150 and the intermediate insulation layer 160 from the peripheral area PA, the spaces SP are formed outside of the chamber portions 142 to be connected to the slits 143, respectively. The spaces SP may be positioned between the chamber portions 142, the lower insulation layer 150 and the intermediate insulation layer 160.

Since the spaces SP communicate with the air gap AG through the slits 143, a acoustic wave may pass between the air gap AG and the spaces SP. Since the spaces SP are located on a path through which the acoustic wave flows, the spaces SP may serve as a band stop filter that suppresses or attenuates an intensity of a signal having a specific frequency in the acoustic wave. Accordingly, the spaces SP may attenuate a noise component of the specific frequency in the acoustic wave, the MEMS microphone 100 may have improved signal-to-noise ratio (SNR) characteristics.

As described above, according to some example embodiments of the MEMS microphone, the spaces SP may communicate with the air gap AG through the slits 143. Since the spaces SP functions as the band-stop filter, the spaces SP may attenuate the noise component of the specific frequency in the acoustic wave. Accordingly, the signal-to-noise ratio (SNR) characteristics of the MEMS microphone 100 may be improved.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A Micro Electro Mechanical Systems (MEMS) microphone comprising:
   a substrate including:
      a vibration area defining a cavity,
      a supporting area surrounding the vibration area, and
      a peripheral area surrounding the supporting area;
   a diaphragm disposed over the substrate to cover the cavity, the diaphragm defining an air gap together with the back plate, and the diaphragm being spaced apart from the substrate to be configured to sense an acoustic pressure to generate a corresponding displacement;
   a back plate disposed over the diaphragm and in the vibration area, and the back plate being spaced apart from the diaphragm to form an air gap, and defining a plurality of first acoustic holes;
   an upper insulation layer arranged to cover the back plate, the upper insulation layer being configured to hold the back plate such that the back plate is spaced apart from the diaphragm;
   a plurality of chamber portions provided in the supporting area, spaced apart from each other along a circumference of the vibration area, each of the plurality of chamber portions having a lower surface in contact with an upper surface of the substrate to support the upper insulation layer;
   a lower insulation layer provided under the upper insulation layer and on the substrate and disposed further from the vibration area than the chamber portions; and
   an intermediate insulation layer provided between the lower insulation layer and the upper insulation layer and disposed outside of the chamber portions,
   wherein a plurality of slits is provided between the chamber portions to expose the upper surface of the substrate and communicating with the air gap, and a plurality of spaces is provided outside of the chamber portion, and in fluid communication with the slits, respectively.

2. The MEMS microphone of claim 1, further comprising a plurality of second acoustic holes provided to penetrate through the upper insulation layer over the slits to serve as a fluid path of etchant for forming the spaces by removing the lower insulation layer and the intermediate insulation layer.

3. The MEMS microphone of claim 1, further comprising:
   a diaphragm pad positioned on the lower insulation layer and electrically connected to the diaphragm; and
   a back plate pad positioned on the intermediate insulation layer and electrically connected to the back plate;
   wherein the diaphragm pad and the back plate pad are respectively connected to the diaphragm and the back plate through the slits.

4. The MEMS microphone of claim 1, wherein the diaphragm includes a plurality of vent holes penetrating through the diaphragm, the plurality of vent holes arranged to be spaced apart from each other along the circumference of the diaphragm.

5. The MEMS microphone of claim 4, wherein the vent holes are alternatively arranged with the first acoustic holes, respectively, to prevent an acoustic wave to be directly transmitted between the vent holes and the first acoustic holes.

6. The MEMS microphone of claim 1, further comprising an anchor being connected to an end portion of the diaphragm along a circumference of the diaphragm to be anchored to a lower surface of the substrate to support the diaphragm from the substrate.

7. A method of manufacturing a Micro Electro Mechanical Systems (MEMS) microphone comprising:
   forming an insulation layer on a substrate being divided into a vibration area, a supporting area surrounding the vibration area and a peripheral area surrounding the supporting area;
   forming a diaphragm in the vibration area and an anchor supporting the diaphragm in the supporting area, respectively, on the lower insulation layer;
   forming an intermediate insulation layer on the lower insulation layer on which the diaphragm is formed;
   forming a back plate on the intermediate insulation layer in the vibration area, the back plate facing the diaphragm;
   patterning the intermediate insulation layer and the lower insulation layer in the supporting area to form a plurality of chamber channels for forming chambers, being spaced apart from each other along a periphery of the vibration area;
   depositing an insulating layer on the intermediate insulation layer in which the back plate and the chamber channels;
   patterning the insulating layer to form the upper insulation layer that mechanically supports the back plate and spaces the back plate apart from the diaphragm, and chambers portions spaced apart from each other for supporting the back plate;
   patterning the back plate and the upper insulation layer to form first acoustic holes of penetrating the back plate and the upper insulation layer;
   patterning the substrate to form a cavity to partially expose the lower insulation layer in the vibration area; and
   performing an etch process using the cavity and the first acoustic holes with completely removing portions of the lower insulation layer and the intermediate insulation layer in both the vibration area and the supporting area, and partially removing the portions in the peripheral area to form an air gap between the diaphragm and the back plate, a plurality of slits communicating with the air gap, disposed between the chamber portions, and spaces outside of the chamber portions, communicating with the slits, respectively.

8. The method of claim 7, wherein forming the first acoustic holes includes forming second acoustic holes disposed between the chamber portions, respectively, and penetrating through the upper insulation layer, wherein the second acoustic holes serve as fluid paths for an etchant for forming the spaces by removing the lower insulation layer and the intermediate insulation layer.

9. The method of claim 7, wherein forming of the diaphragm and the anchor includes:
    patterning the lower insulation layer to form an anchor channel for forming the anchor in the supporting area;
    forming a first silicon layer on the lower insulation layer on which the anchor channel is formed; and
    patterning the first silicon layer to form the diaphragm in the vibration area and the anchor in the supporting area.

10. The method of claim 9, wherein forming the diaphragm and the anchor comprises patterning the first silicon layer to form a plurality of vent holes of penetrating the diaphragm, and the vent holes are located in the vibration area.

11. The method of claim 10, wherein the vent holes are alternatively arranged with the first acoustic holes, respectively, to prevent an acoustic wave to be directly transmitted between the vent holes and the first acoustic holes.

12. The method of claim 11, wherein the vent holes serve as fluid paths for an etchant for removing the lower insulation layer and the intermediate insulation layer.

13. The method of claim 9, wherein forming the diaphragm and the anchor includes patterning the first silicon layer to form a diaphragm pad in the peripheral area, being electrically connected to the diaphragm.

14. The method of claim 13, wherein the diaphragm pad is connected to the diaphragm through a space between the chamber portions adjacent to each other.

15. The method of claim 7, wherein forming the back plate comprises:
    forming a second silicon layer on the intermediate insulation layer; and
    patterning the second silicon layer to forming the back plate in the vibration area and a back plate pad connected to the back plate in the peripheral area simultaneously.

16. The method of claim 15, wherein the back plate pad is connected to the back plate through a space between the chamber portions adjacent to each other.

* * * * *